(12) United States Patent
Aoyagi et al.

(10) Patent No.: US 7,675,070 B2
(45) Date of Patent: Mar. 9, 2010

(54) LED HAVING A REFLECTOR LAYER OF IMPROVED CONTACT OHMICITY

(75) Inventors: Hidekazu Aoyagi, Niiza (JP); Koji Otsuka, Niiza (JP)

(73) Assignee: Sanken Electric Co., Ltd. (JP)

( * ) Notice: Subject to any disclaimer, the term of this patent is extended or adjusted under 35 U.S.C. 154(b) by 573 days.

(21) Appl. No.: 11/619,079

(22) Filed: Jan. 2, 2007

(65) Prior Publication Data

US 2007/0102711 A1    May 10, 2007

Related U.S. Application Data

(63) Continuation of application No. PCT/JP2005/012210, filed on Jul. 1, 2005.

(30) Foreign Application Priority Data

Jul. 7, 2004    (JP) .............................. 2004-200849

(51) Int. Cl.
*H01L 27/15* (2006.01)
*H01L 31/12* (2006.01)
*H01L 33/00* (2006.01)

(52) U.S. Cl. .............................. 257/79; 257/82; 257/88; 438/22

(58) Field of Classification Search .................... 257/79, 257/82, 88, E33.056, E33.059, E25.032; 438/22

See application file for complete search history.

(56) References Cited

U.S. PATENT DOCUMENTS 6,072,818 A * 6/2000 Hayakawa .............. 372/46.014
6,377,597 B1 * 4/2002 Okumura .................. 372/45.01

FOREIGN PATENT DOCUMENTS

| JP | 11-191641 A | 7/1999 |
| JP | 2000-082845 A | 3/2000 |
| JP | 2001-196629 A | 7/2001 |
| JP | 2001-244503 A | 9/2001 |
| JP | 2002-151733 A | 5/2002 |
| JP | 2002-217450 A | 8/2002 |
| JP | 2003-163366 A | 6/2003 |
| JP | 2004-006919 A | 1/2004 |
| JP | 2004-146652 A | 5/2004 |
| JP | 2004-179365 A | 6/2004 |

* cited by examiner

*Primary Examiner*—Theresa T Doan
(74) *Attorney, Agent, or Firm*—Woodcock Washburn LLP

(57) ABSTRACT

An LED has a light-generating semiconductor region formed on a baseplate via an electroconductive reflector layer. The light-generating semiconductor region has an active layer sandwiched between a pair of claddings of opposite conductivity types for generating light. For good ohmic contact with the light-generating semiconductor region without any substantive diminution of reflectivity compared to that of unalloyed silver, the reflector layer is made from a silver-base alloy containing a major proportion of silver and at least either one of copper, gold, palladium, neodymium, silicon, iridium, nickel, tungsten, zinc, gallium, titanium, magnesium, yttrium, indium, and tin.

7 Claims, 5 Drawing Sheets

LED HAVING A REFLECTOR LAYER OF IMPROVED CONTACT OHMICITY

CROSS REFERENCE TO RELATED APPLICATIONS

This is a continuation of Application PCT/JP2005/012210, filed Jul. 1, 2005, which claims priority to Japanese Patent Application No. 2004-200849 filed Jul. 7, 2004.

BACKGROUND OF THE INVENTION

This invention relates to light-emitting semiconductor devices, or light-emitting diodes (LEDs) according to more common parlance, and more particularly to such devices of the class suitable for use in displays and lamps, among other applications. The invention also concerns a method of making such light-emitting semiconductor devices.

The LED has been known which has a light-generating semiconductor region comprised of an active layer sandwiched between an n-type cladding or lower confining layer, which overlies the substrate, and a p-type cladding or upper confining layer. Part of the light generated in the active layer mostly directly traverses the upper confining layer and issues from one of the opposite major surfaces of the semiconductor region. The rest of the light is radiated more or less toward the substrate via the lower confining layer. How to redirect the highest possible percentage of this light component back toward the light-emitting surface of the semiconductor region is of critical importance for maximizing the efficiency of the LED.

One conventional approach to this goal was to place a reflector layer on the underside of the substrate, for reflecting the light that has traveled through the substrate. An obvious drawback to this approach was the inevitable light absorption by the substrate, both before and after reflection by the reflector. Lying in the way of bidirectional light travel, the substrate considerably lessened the efficiency of the LED. Another difficulty was the high electrical resistance between the light-generating semiconductor region and the substrate. This second mentioned difficulty brought about an additional inconvenience in those LEDs in which the substrate provides part of the current path, with a cathode, say, attached to the substrate. The forward voltage between the anode and cathode became inconveniently high in such LEDs.

Japanese Unexamined Patent Publication No. 2002-217450, filed by the assignee of the instant application, represents an improvement over the more conventional solution described above. It teaches the creation of a sparse or open-worked layer of gold-germanium-gallium alloy on the underside of the light-generating semiconductor region. This sparse alloy layer, as well as the surface parts of the semiconductor region left uncovered thereby, is covered by a solid reflector layer of aluminum or other metal. An electroconductive silicon baseplate is bonded to the underside of the solid metal-made reflector layer.

Making good ohmic contact with the light-generating semiconductor region of Groups III-V compound semiconductors such as, say, aluminum gallium indium phosphide, the open-worked gold-germanium-gallium alloy regions serve to make the LED lower in forward voltage requirement. The reflector layer itself of this prior art LED reflects the light impinging thereon from the light-generating semiconductor region via the open-worked alloy layer, instead of via the substrate as in the more conventional device. A significant improvement was thus gained in the efficiency of conversion from electric to optical energy.

The last cited prior art LED proved to possess its own weaknesses, however. Although capable of low-resistance contact with the light-generating semiconductor region, the open-worked layer of gold-germanium-gallium alloy poorly lacks in reflectivity. The solid metal-made reflector layer on the other hand is reflective enough but incapable of low-resistance contact with the light-generating semiconductor region. These inconveniences combined to make it difficult for the LED to accomplish the desired dual objective of low forward voltage requirement and high efficiency light production.

What is worse, in the course of the manufacturing process of the prior art LED, which involves thermal treatments, the solid metal-made reflector layer and open-worked alloy layer were prone to interaction with the light-generating semiconductor region to the impairment of reflectivity at their interfaces. The manufacture of high-efficiency LEDs of this type was therefore no easy task.

Japanese Unexamined Patent Publication No. 2004-179365 teaches the creation of an ohmic electrode of platinum, rhodium or silver on the non-light-emitting surface of a nitride semiconductor region. Japanese Unexamined Patent Publication No. 2004-006919 also suggests the creation of an ohmic electrode of gold, platinum, silver or nickel between the nitride semiconductor region and a substrate of gallium arsenide or the like. The ohmic electrode of such placement is required to be favorable not only in contact ohmicity but in reflectivity too. Contrary to this dual requirement, silver in particular is susceptible to oxidation or sulfurization. The silver electrode on oxidation or sulfurization will deteriorate in both reflectivity and contact ohmicity and also make it difficult to bond the nitride semiconductor region to the substrate.

SUMMARY OF THE INVENTION

The present invention has it as an object to improve, in a light-emitting semiconductor device of the kind defined, the contact ohmicity of the electroconductive reflector layer with respect to the light-generating semiconductor region without significantly attenuating its reflectivity.

Briefly, the present invention provides a light-emitting semiconductor device comprising a light-generating semiconductor region having a plurality of semiconductor layers for generating light. A baseplate is held against one of a pair of opposite major surfaces of the light-generating semiconductor region, and an electrode is formed on the other major surface of the light-generating semiconductor region. Interposed between the baseplate and the light-generating semiconductor region is a reflector layer for reflecting the light from the light-generating semiconductor region toward said other major surface of the light-generating semiconductor region. The reflector layer is made from a silver-base alloy containing a major proportion of silver and at least one additive selected from among copper, gold, palladium, neodymium, silicon, iridium, nickel, tungsten, zinc, gallium, titanium, magnesium, yttrium, indium, and tin. The proportion of the selected additive or additives with respect to that of silver is in the range of from 0.5 percent by weight to 10.0 percent by weight.

The baseplate is designed for use as a mechanical support for the light-generating semiconductor region and so must be distinguished from a substrate on which the region is grown. The baseplate may therefore be either electrically conducting or insulating. Conductors employable as baseplate materials include copper, silver, aluminum, nickel, platinum and other metals as well as silicon, gallium arsenide and other semiconductors plus conductivity determinants. The baseplate may also be made from such insulators as quartz glass, soda-lime glass, and sapphire.

The light-generating semiconductor region may be of known make comprising at least two semiconductor layers of opposite conductivity types, preferably with an active layer therebetween.

Experiment has proved that, admixed with any of the above listed additives in the specified range of proportions, silver gains immunity from oxidation and sulfurization without suffering any significant drop in reflectivity. Thus the silver-base alloy according to the invention is well suited for use as a material of a reflector layer that is favorable in both reflectivity and contact ohmicity with respect to the light-generating semiconductor region.

The invention also concerns a method of fabricating the light-emitting semiconductor device of the above summarized construction. The constituent layers of the light-generating semiconductor region are first grown successively in vapor phase on a substrate. The thus formed light-generating semiconductor region has a first major surface facing away from the substrate and a second major surface held against the substrate. Then a reflector layer is made from a silver-base alloy of the above specified composition is created on at least either of the first major surface of the light-generating semiconductor region and a major surface of a baseplate which has been prepared separately. Then the baseplate is bonded to the light-generating semiconductor region via the reflector layer. The substrate, which becomes unnecessary upon completion of the light-generating semiconductor region thereon, is removed from the light-generating semiconductor region either before or after the bonding of the baseplate. Then an electrode is created on the thus exposed second major surface of the light-generating semiconductor region.

Preferably, for bonding the baseplate to the light-generating semiconductor region, a reflector sublayer of the above silver-base alloy is formed on the first major surface of the light-generating semiconductor region to half the thickness of the desired reflector layer. Another reflector sublayer of the same silver-base alloy is formed on the major surface of the baseplate to half the thickness of the desired reflector layer. Then the light-generating semiconductor region and the baseplate are bonded to each other by uniting the two reflector sublayers under heat and pressure.

The two reflector sublayers are united as above into the reflector layer of the required thickness. Thus the reflector layer serves as a bonding agent as well, and the bonding of the light-generating semiconductor region and baseplate is concurrent with the creation of the reflector layer.

The above and other objects, features and advantages of this invention will become more apparent, and the invention itself will best be understood, from a study of the following description and appended claims, with reference had to the attached drawings showing some preferable embodiments of the invention.

DETAILED DESCRIPTION OF THE INVENTION

Figure 1:
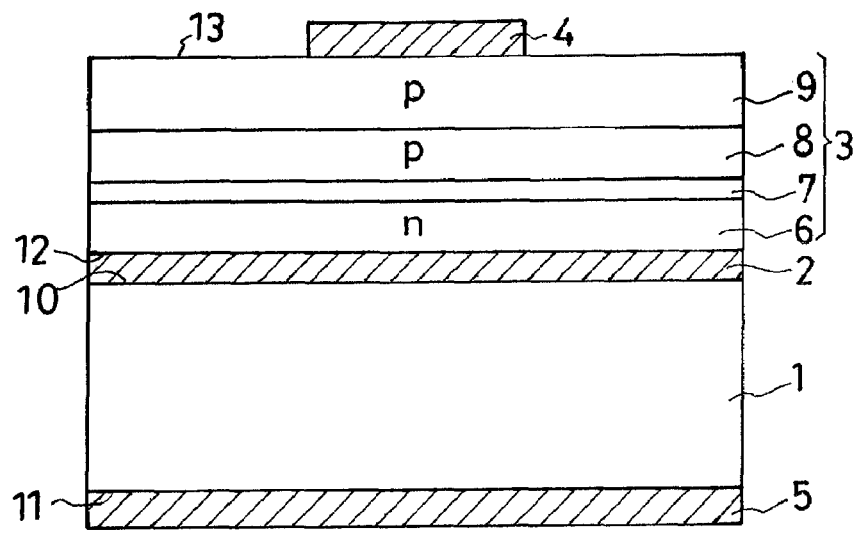
FIG. 1 is a sectional illustration of the LED embodying the principles of this invention.

The present invention is believed to be best embodied in the LED shown completed in FIG. 1 and in successive states of fabrication in FIGS. 2-6. With particular reference to FIG. 1 the representative LED broadly comprises:

1. An electroconductive baseplate 1 providing both mechanical support and current path for the LED.

2. A reflector layer 2 of electroconductive material directly overlying the baseplate 1, the reflector layer being made from any of the silver-base alloys of specific compositions according to the invention to be detailed subsequently.

3. A light-generating semiconductor region 3 where light is produced and which is herein shown constituted of four layers in lamination to be set forth shortly.

4. A first electrode or anode 4 in the form of a bonding pad positioned centrally on one of the pair of opposite major surfaces of the light-generating semiconductor region 3.

5. A second electrode or cathode 5 formed on the complete underside of the baseplate 1.

In order to provide a double heterojunction LED as one possible application of the invention, the light-generating semiconductor region 3 is shown comprising an n-type semiconductor layer or lower cladding 6, an active layer 7, a p-type semiconductor layer or upper cladding 8, and a p-type complementary semiconductor layer 9. The compositions of the constituent layers 6-9 of the light-generating semiconductor region 3 will be disclosed later.

The baseplate 1 is made from an electroconductive silicon semiconductor to possess a pair of opposite major surfaces 10 and 11. The reflector layer 2 is formed on the first or upper major surface 10, and the cathode 5 on the second or lower major surface 11. The baseplate 1 is doped with an n-type impurity to a concentration of $5 \times 10^{18}$ cm$^{-3}$ through $5 \times 10^{19}$ cm$^{-3}$, although a p-type dopant could be employed instead. In order to provide part of the current path between the electrodes 4 and 5, the baseplate 1 is as low in resistivity as from 0.0001 ohm-cm to 0.0100 ohm-cm. The baseplate 1 should be sufficiently thick (e.g., 300-1000 micrometers) to serve as a mechanical support for the reflector layer 2, light-generating semiconductor region 3, and electrodes 4 and 5.

Interposed between baseplate 1 and light-generating semiconductor region 3, the silver-base alloy reflector layer 2 makes good ohmic contact with both the upper major surface 10 of the former and the lower major surface 12 of the latter. The reflector layer 2 is of such improved compositions according to the invention, as set forth in the next paragraph, that it can reflect not less than ninety percent of the light in the wavelength range of 400-600 nanometers coming from the light-generating semiconductor region 3. Unlike the gold-germanium-gallium alloy layer proposed by Japanese Unexamined Patent Publication No. 2002-217450, supra, the reflector layer 2 of this invention need not be created sparsely thanks to its high reflectivity and ohmicity. The reflector layer 2 should preferably cover the entire lower major surface 12 of the light-generating semiconductor region 3. Speaking more broadly, however, the reflector layer 2 may cover 50-100 percent, preferably 90-100 percent, of the lower major surface 12 of the light-generating semiconductor region 3.

The present invention hereby suggests a class of silver-base alloys as optimal materials for the reflector layer 2. Currently believed to be most desirable are silver-base alloys containing from about 90.0 percent to about 99.5 percent by weight silver, and from about 0.5 percent to about 10.0 percent by weight of additive or additives. The additive or additives may be chosen from among such alloyable materials as copper, gold, palladium, neodymium, silicon, iridium, nickel, tungsten, zinc, gallium, titanium, magnesium, yttrium, indium, and tin.

The additives listed above are effective for one or more of the purposes of: (a) preventing the oxidation of the reflector layer 2; (b) preventing the sulfurization of the reflector layer 2; and (3) preventing the alloying of the metals in the reflector layer 2 and light-generating semiconductor region 3. Copper and gold are especially effective for anti-oxidation purposes, and zinc and tin for anti-sulfurization purposes. Should the silver-containing reflector layer 2 be oxidized or sulfurized, it would make poorer ohmic contact with the baseplate 1 and light-generating semiconductor region 3 and also suffer in reflectivity. The reflector layer 2 would also become less reflective in the event of the appearance of a thick alloy layer at its interface with the light-generating semiconductor region 3. Furthermore, as will become more apparent from the subsequent presentation of the method of fabrication, the reflector layer 2 is used for bonding the light-generating semiconductor region 3 to the baseplate 1 as well. The reflector layer 2 on oxidation or sulfurization would seriously hamper such bonding.

In use of the silver-base alloy for the reflector layer 2, the higher the proportion of the additive or additives, the less will the resulting layer be susceptible to oxidation or sulfurization, but, at the same time, the less reflective will it be. Therefore, in order to assure higher reflectivity and contact ohmicity for the reflector layer 2 than those of the reflector in the above cited Unexamined Japanese Patent Publication No. 2002-217450, the proportion of the additive or additives with respect to that of silver is hereby set in the range of from 0.5 percent to 10.0 percent by weight, preferably from 1.5 percent to 5.0 percent by weight. The reflector layer would not be sufficiently immune from oxidation or sulfurization if the additive proportion were less than 0.5 percent by weight, and not sufficiently reflective if the additive proportion were more than 10.0 percent by weight.

The reflector layer 2 should be not less than 50 nanometers thick in order to prevent transmission of the light therethrough, and not less than 80 nanometers thick for firmly bonding the light-generating semiconductor region 3 to the baseplate 1. However, the silver-base alloy reflector layer 2 would crack if the thickness exceeded 1500 nanometers. The reflector layer 2 should therefore be from about 50 nanometers to about 1500 nanometers thick, preferably from about 80 nanometers to about 1000 nanometers thick.

The light-generating semiconductor region 3 of this embodiment is configured to provide a double heterojunction LED. Aside from impurities, the n-type cladding 6 of the light generating semiconductor region 3 is fabricated from any of nitride semiconductors that are generally defined as:

$$Al_xIn_yGa_{1-x-y}N$$

where the subscripts x and y are both numerals that are equal to or greater than zero and less than one. Thus the formula encompasses not only aluminum indium gallium nitride but also indium gallium nitride (x=0), aluminum gallium nitride (y=0), and gallium nitride (x=0, y=0). Gallium nitride plus an n-type dopant is a currently preferred material for the cladding 6.

Overlying the n-type cladding 6, the active layer 7 is made from any of undoped nitride semiconductors that are generally expressed as:

$$Al_xIn_yGa_{1-x-y}N$$

where the subscripts x and y are both numerals that are equal to or greater than zero and less than one. Currently preferred is InGaN (x=0). In practice the active layer 7 may take the form of either multiple or single quantum well structure. The active layer 7 may also be doped with a p- or n-type conductivity determinant. It is even possible to eliminate the active layer 7 altogether and to place the n- and p-type semiconductor layers 6 and 8 in direct contact with each other.

The p-type cladding 8 over the active layer 7 is made by adding a p-type impurity to any of the nitride semiconductors that are generally defined as:

$$Al_xIn_yGa_{1-x-y}N$$

where the subscripts x and y are both numerals that are equal to or greater than zero and less than one. Currently preferred is p-type GaN (x=0, y=0).

The p-type complementary layer 9 over the p-type cladding 8 serves both for greater uniformity of current distribution and for better contact ohmicity. It is made from GaN, the same material as is the cladding 8, but with a p-type impurity added to a higher concentration than that of that cladding.

As required or desired, this complementary layer 9 may take the form of a lamination of a required number of alternations of a first and a second complementary sublayer. The first complementary sublayers may be made from any of the nitrides of the following general composition plus a p-type dopant:

$$A Al_xM_yGa_{1-x-y}N$$

where M is at least either of indium and boron; the subscript x is a numeral that is greater than zero and equal to or less than one; the subscript y is a numeral that is equal to or greater than zero and less than one; and the sum of x and y is equal to or less than one. The second complementary sublayers may be made from any of the nitrides of the following general composition plus a p-type dopant:

$$Al_aM_bGa_{1-a-b}N$$

where M is at least either of indium and boron; the subscripts a and b are both numerals that are equal to or greater than zero and less than one; the sum of a and b is equal to or less than one; and the subscript a is less than the subscript x in the formula above defining the materials for the first complementary sublayers.

Each first complementary sublayer may be about 0.5-10.0 nanometers thick, and each second complementary sublayers about 1-100 nanometers thick. The mono- or multilayered complementary layer 9 is not essential, so that it may be removed, and the first electrode or anode 4 placed directly on the p-type cladding 8.

The anode 4 is shown placed centrally on the exposed surface of the complementary layer 9, or on the upper major surface or light-emitting surface 13 of the light-generating semiconductor region 3, and electrically coupled thereto. The anode 4 takes the form of an opaque bonding pad, itself well known in the art, which permits the electroconductive bonding of wire. Alternatively, such a bonding pad may overlie the complementary layer 9 via a prior art transparent electrode, as in one of the preferred embodiments of the invention to be disclosed subsequently. The cathode 5 underlies the complete lower major surface 11 of the baseplate 1 in electric contact therewith.

In the operation of the LED constructed as described hereinabove with reference to FIG. 1, light will be generated in the active layer 7 upon application of a forward voltage between anode 4 and cathode 5. Radiated toward the light-emitting surface 13 of the semiconductor region 3, part of the light will issue from that part of the surface 13 which is left exposed by the anode 4. The rest of the light will fall on the reflector 2 and be thereby redirected back toward the light-emitting surface 13, emerging therefrom together with the light that has been directly radiated toward the same.

Method of Fabrication

Figure 2:
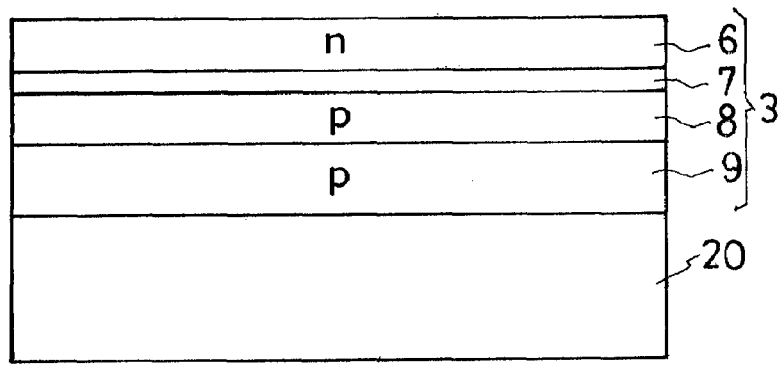
FIG. 2 is a section through the light-generating semiconductor region of the LED, shown together with the substrate on which it has been grown, by way of a first step for fabricating the LED of FIG. 1 by the method of this invention.
Figure 3:
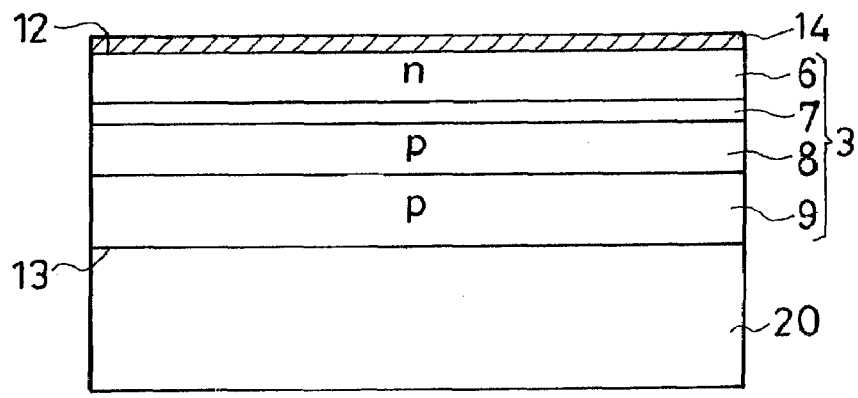
FIG. 3 is a view similar to FIG. 2 except that a reflector sublayer is shown formed on the light-generating semiconductor region preparatory to its bonding to a baseplate.

The fabrication of the LED of FIG. 1 by the method of this invention starts with the preparation of the substrate seen at 20 in FIG. 2. Unlike the baseplate 1 shown in FIG. 1, the substrate 20 is intended for gaseous-phase growth of the light-generating semiconductor region 3 thereon, so that it must be of a substance that meets this objective. Examples of such a substance include gallium arsenide or like Groups III-V semiconductors, silicon, and sapphire. Silicon in particular is desirable for its low cost.

Then, as pictured also in FIG. 2, the constituent layers of the light-generating semiconductor region 3 are successively grown in gaseous phase on the substrate 20 in the order of top to bottom in FIG. 1, that is, the complementary layer 9 first and the cladding 6 last. First grown on the substrate 20, the complementary layer 9 will serve as a buffer for the cladding 8, active layer 7, and cladding 6 grown subsequently.

The next step is the bonding of the baseplate 1 to the light-generating semiconductor region 3 which has been grown as above on the substrate 20. The baseplate 1 is bonded to the light-generating semiconductor region 3 via the reflector layer 2, FIG. 1, of the novel silver-base alloy according to the invention. To this end a first reflector sublayer 14, FIG. 3, may be created as by sputtering on the major surface 12 of the light-generating semiconductor region 3 to approximately half the thickness of the reflector layer 2 to be formed. The first reflector sublayer 14 should be of any of the class of the silver-base alloys set forth above.

Figure 4:
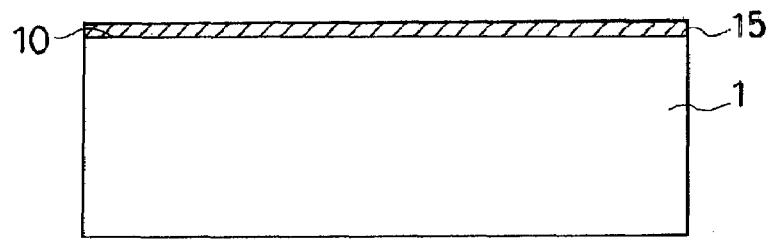
FIG. 4 is a sectional illustration showing the baseplate with another reflector sublayer formed thereon.

Then, as illustrated in FIG. 4, a second reflector sublayer 15 of the same composition as the first reflector sublayer 14 may be formed, also as by sputtering, on the surface 10 of the electroconductive silicon baseplate 1. This second reflector sublayer 15 may also be created to approximately half the thickness of the desired reflector layer 2.

Figure 5:
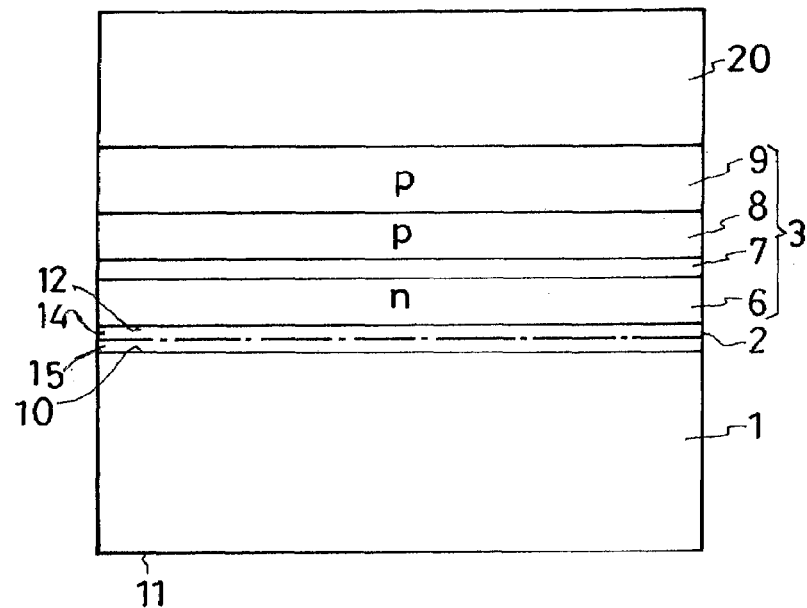
FIG. 5 is a view similar to FIG. 2 but showing the light-generating semiconductor region of FIG. 3 and the baseplate of FIG. 4 bonded together via the two preformed reflector sublayers.

FIG. 5 shows the first reflector sublayer 14 on the surface 12 of the light-generating semiconductor region 3 subsequently held against the second reflector sublayer 15 on the surface 10 of the baseplate 1. Heated to a temperature in the range of 210° to 400° C. under pressure, the two reflector sublayer 14 and 15 unite into the reflector layer 2. As has been explained with reference to FIG. 1, the reflector layer 2 will make good ohmic contact with both baseplate 1 and light-generating semiconductor region 3 and be sufficiently high in reflectivity for the purposes of the invention.

Figure 6:
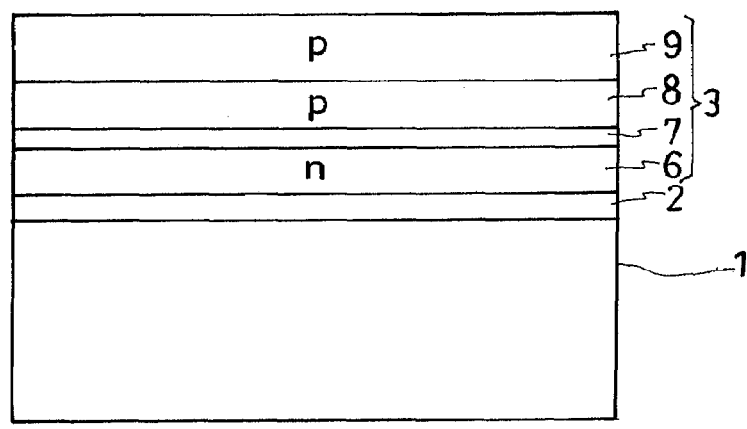
FIG. 6 is a view similar to FIG. 5 but not showing the substrate, which has been removed from the light-generating semiconductor region.

Then the substrate 20 is removed from the light-generating semiconductor region 3 as in FIG. 6, thereby exposing the light-emitting surface 13 of that region. The substrate 20 is removable either chemically, as by etching, or by machining. Having been unnecessary upon completion of the light-generating semiconductor region 3 thereon, the substrate 20 may be removed prior to the bonding of the baseplate 1 to the light-generating semiconductor region 3.

Then the electrodes 4 and 5 are conventionally formed in the positions indicated in FIG. 1. LEDs according to the invention are usually mass produced by dicing the semiconductor wafer fabricated as above.

Figure 7:
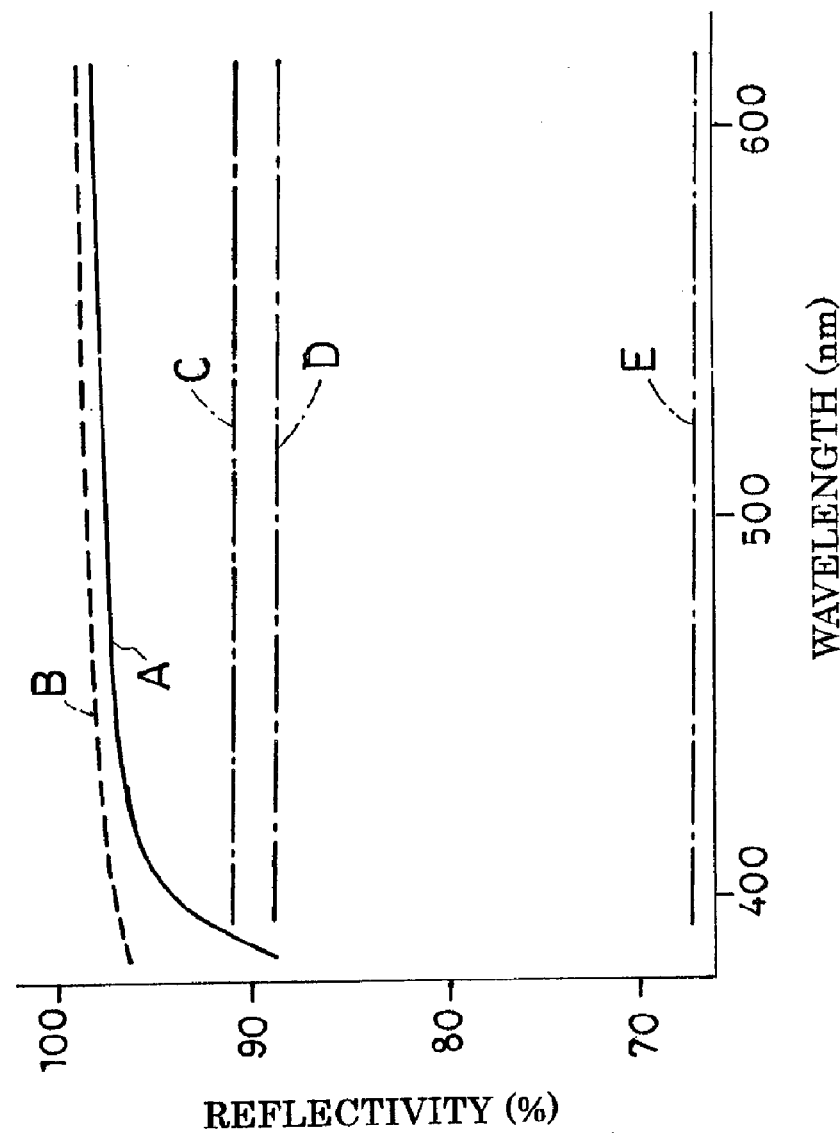
FIG. 7 is a graph explanatory of the reflectivity of the silver-base alloy of this invention in comparison with the reflectivities of some known reflector materials.

The curves A-E in the graph of FIG. 7 represent the reflectivities of reflector layers composed of various materials in LEDs of the FIG. 1 construction against the wavelength of the light which is generated by the LEDs and which is reflected by the reflector layers. The reflector materials tested were the silver-base alloy according to the invention (curve A), unalloyed silver (curve B), unalloyed aluminum (curve C), aluminum-base alloy (curve D), and a lamination of nickel-gold alloy and aluminum sublayers (curve E).

The curve A in the graph indicates that the silver-base alloy reflector layer according to the invention has a reflectivity of well over 90 percent with respect to light in a wavelength range of 400-600 nanometers. This reflectivity of the silver-base alloy according to the invention is much higher than the reflectivities of unalloyed aluminum, aluminum-base alloy, and a combination of nickel-gold alloy and unalloyed aluminum, and even comparable to that of unalloyed silver. The reflectivity of the silver-base alloy according to the invention is comparable to that of unalloyed silver obviously because, unlike the latter, the silver-base alloy is effectively prevented from oxidation and sulfurization as well as from silver coagulation by virtue of its own composition.

The following is a list of advantages gained by this first preferred embodiment of the invention over the prior art:

1. Made from the silver-base alloys of the above specified compositions according to the invention, the reflector layer 2 has greater immunity to oxidation and sulfurization than does the prior art unalloyed silver layer. As a consequence, the silver-base alloy reflector layer possesses almost as high reflectivity as that of the unalloyed silver layer and even higher contact ohmicity with respect to the light-generating semiconductor region 3.

2. The silver-base alloy reflector layer 2 with its improved immunity to oxidation and sulfurization makes it possible for the baseplate 1 to be bonded more firmly to the light-generating semiconductor region 3 by the method of this invention than does the prior art unalloyed silver reflector layer.

3. In contrast to the sparse arrangement of the Au—Ge—Ga alloy ohmic contact layer between light-generating semiconductor region and reflector layer according to Japanese Unexamined Patent Publication No. 2002-217450, supra, the silver-base alloy reflector layer 2 according to the invention makes, by itself, good ohmic contact with the entire surfaces of the baseplate 1 and light-generating semiconductor region 3. The reflector layer 2 is therefore capable of reflecting a far more percentage of the light generated than the prior art combination of the sparse Au—Ge—Ga alloy layer and reflector layer, enabling the LED to emit light of given intensity with the application of a less forward voltage between the electrodes 4 and 5.

4. Also unlike the above unexamined Japanese patent application, which requires both reflector layer and ohmic contact layer of Au—Ge—Ga alloy, the invention necessitates only the reflector layer 2 for both high reflectivity and contact ohmicity.

Figure 8:
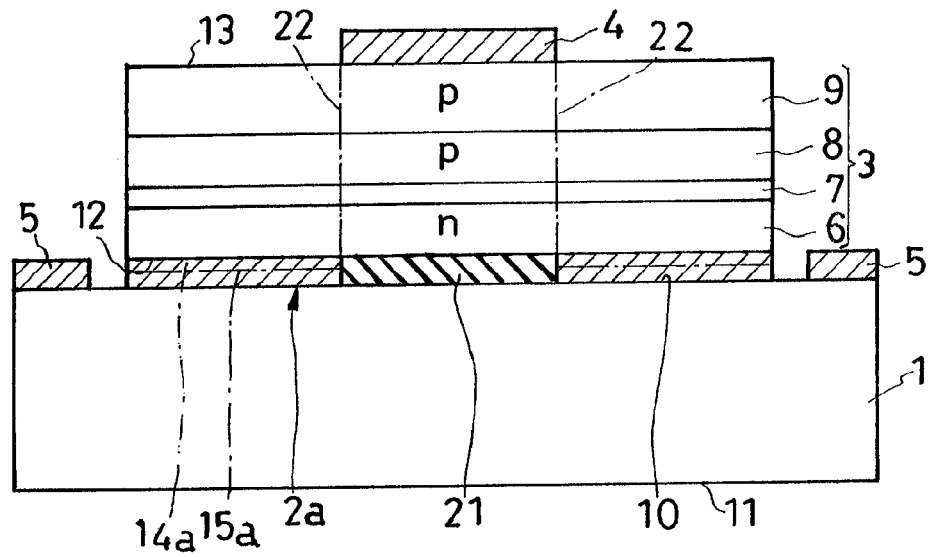
FIG. 8 is a sectional illustration of another preferred form of LED according to the invention.

Embodiment of FIG. 8

FIG. 8 shows another preferred form of LED embodying the principles of the present invention. This LED differs from that of FIG. 1 in:

1. A difference in size between baseplate 1 and light-generating semiconductor region 3.
2. The position and shape of the second electrode or cathode 5.
3. The introduction of a current blocking layer or current baffle 21.
4. The shape of a reflector layer $2_a$.

As seen from above the LED, the baseplate 1 is larger than the light-generating semiconductor region 3. With the light-generating semiconductor region 3 placed centrally on its upper major surface 10, the baseplate 1 has an annular ledge protruding outwardly of the semiconductor region 3. The cathode 5 is formed on this annular ledge of the baseplate 1 in electrical contact therewith and is correspondingly modified in shape.

The current baffle 21 is interposed between the upper major surface 10 of the baseplate 1 and the lower major surface 12 of the light-generating semiconductor region 3 and placed in register with the first electrode or anode 4. The reflector layer $2_a$ is centrally open to accommodate the current baffle 21 and so surrounds the same. Made from an electrically insulating material, the current baffle 21 functions to minimize current flow through the central part, shown bounded by the broken lines labeled 22, of the active layer $2_a$ and hence to relatively augment the amount of current flowing through the annular outer part of the active layer 7. The current baffle 21 may preferably be of the same size as the anode 4, as seen from above the LED, but in practice be somewhat larger or smaller than the same.

The reflector layer $2_a$ is shown to cover all of the annular outer part, other than the central part occupied by the current baffle 21, of the lower major surface 12 of the light-generating semiconductor region 3. Broadly, however, the reflector layer $2_a$ may cover about 50-100 percent, preferably about 90-100 percent, of the annular outer part of the lower major surface 12 of the light-generating semiconductor region 3.

Notwithstanding the showing of FIG. 8 the current baffle 21 need not extend through the reflector layer $2_a$ into contact with the baseplate 1; instead, the current baffle 21 may be formed only to half the thickness of the reflector layer $2_a$. The current baffle 21 will then be surrounded only by the first reflector sublayer $14_a$, indicated by the broken line in FIG. 8, and underlain by the second reflector sublayer $15_a$: as in the embodiment of FIG. 9 to be explained subsequently.

The current baffle 21 is further modifiable in the material from which it is made. It may be made not only from insulating material but from a metal that has a high contact resistance with the light-generating semiconductor region 3 or from a semiconductor. Even a simple cavity in place of the current baffle 21 will be effective to some extent.

The LED of FIG. 8 possesses benefits accruing from the current baffle 21, in addition to all those enumerated in connection with the FIG. 1 embodiment. Being intended for use as a bonding pad, the anode 4 is so thick that the light from the active layer 7 is thereby blocked. Any current flowing through that part of the active layer 7 which underlies the anode 4 is therefore wasted, not utilized for light emission from the LED. The current baffle 21 serves to cause a greater amount of current to flow through the annular outer part of the active layer 7, rather than through its central part under the anode 4, thereby reducing the waste of energy to a minimum. A similar current baffle could be employable in the LED of FIG. 1 as well.

Figure 9:
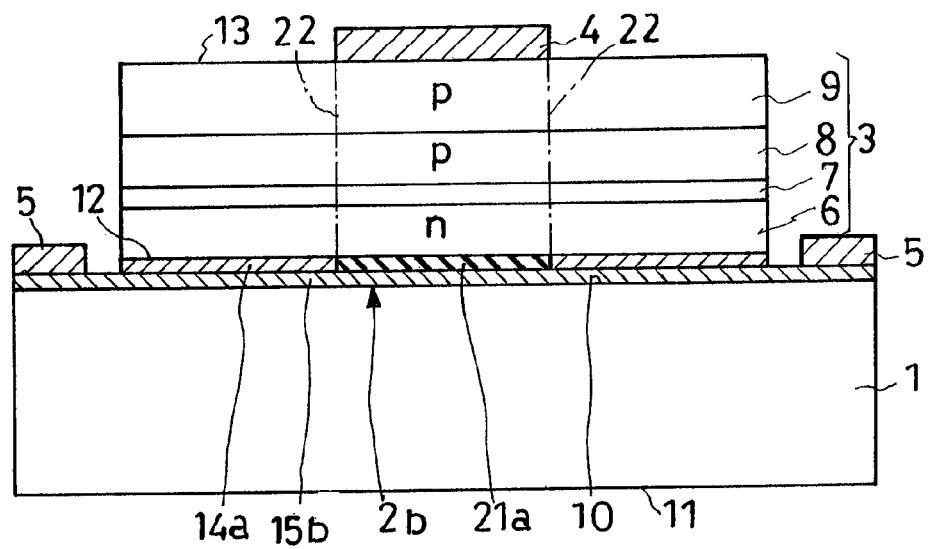
FIG. 9 is a sectional illustration of still another preferred form of LED according to the invention.

Embodiment of FIG. 9

This LED differs from that of FIG. 8 only in a reflector layer $2_b$ and current baffle $21_a$. The reflector layer $2_b$ is formed, as described above with reference to FIGS. 3-5 in conjunction with the LED of FIG. 1, by bonding together a first reflector sublayer $14_a$ on the lower major surface 12 of the light-generating semiconductor region 3 and a second reflector sublayer $15_b$ on the upper major surface 10 of the baseplate 1. The second reflector sublayer $15_b$ differs from its FIG. 8 counterpart $15a$ in covering the entire upper major surface 10 of the baseplate 1 including its annular ledge. The cathode 5 is formed on this annular ledge of the baseplate 1 via the second reflector sublayer $15_b$. The current baffle $21_a$ is buried only in the first reflector sublayer $14_a$ and so is half as thick as the reflector layer $2_b$. The other details of construction are as recited above with reference to the FIG. 8 embodiment.

Perhaps the most pronounced advantage of this FIG. 9 embodiment is that the baseplate 1 need not be electrically conducting. Being not used as part of the current path through the LED, the baseplate 1 may be made from an insulator or a semiconductor that does not make low-resistance contact with the reflector layer $2_b$. The second reflector sublayer $15_b$ of this embodiment might be thought of as a part of the baseplate 1 rather than as a part of the reflector layer $2_b$.

Figure 10:
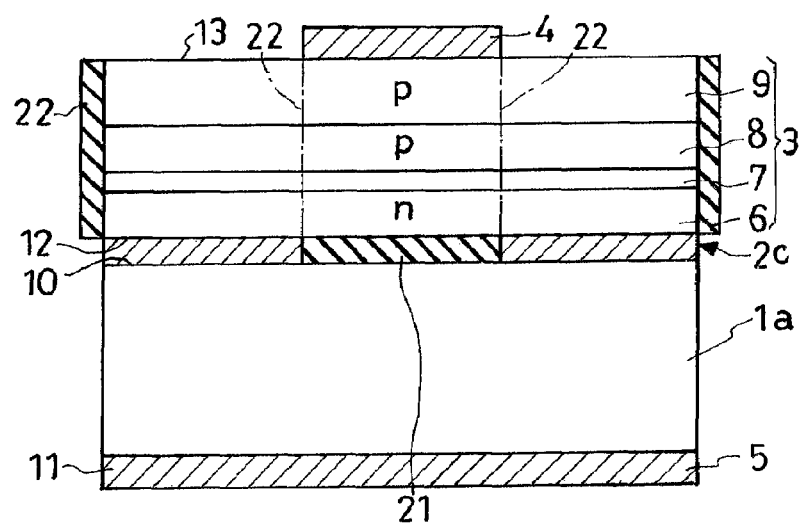
FIG. 10 is a sectional illustration of a further preferred form of LED according to the invention.

Embodiment of FIG. 10

The baseplate $1_a$ of this embodiment is made from a metal that is capable of direct bonding to a reflector layer $2_c$. This reflector layer $2_c$, is wholly preformed on the lower major surface 12 of the light-generating semiconductor region 3 and bonded directly to the upper major surface 10 of the baseplate $1_a$. An electroconductive bonding agent may be employed as required for bonding the baseplate $1_a$ to the light-generating semiconductor region 3 via the reflector layer $2_c$, in which case the baseplate $1_a$ need not be of a material that permits its direct bonding to the reflector layer. The current baffle 21 is embedded in the reflector layer $2_c$ as in the FIG. 8 embodiment.

Another feature of this embodiment resides in a tubular protective covering 22 of electrically insulating material enveloping at least the complete side surface of the light-generating semiconductor region 3. The protective covering 22 is made from silicon oxide or like electric insulator that makes closer contact with the side of the light-generating semiconductor region 3 than the transparent plastics that have been conventionally used for enveloping LEDs. Although shown extending parallel to the LED axis for simplicity, the side of the light-generating semiconductor region 3 is actually at an angle to that axis. The protective covering 22 functions to prevent current leakage and shorting. The silver-base alloy from which the reflector layer $2_c$ is made is easy to migrate onto the side surface of the light-generating semiconductor region 3, should this surface be left exposed. The protective covering 22 prevents such migration of the silver-base alloy.

The other constructional details of this embodiment are as set forth above in connection with that of FIG. 1. It is therefore apparent that this LED possesses all the advantages concerning the silver-base alloy reflector layer $2_c$ and those concerning the current baffle 21. The protective covering 22 could be used with the LEDs of FIGS. 1, 8 and 9.

Figure 11:
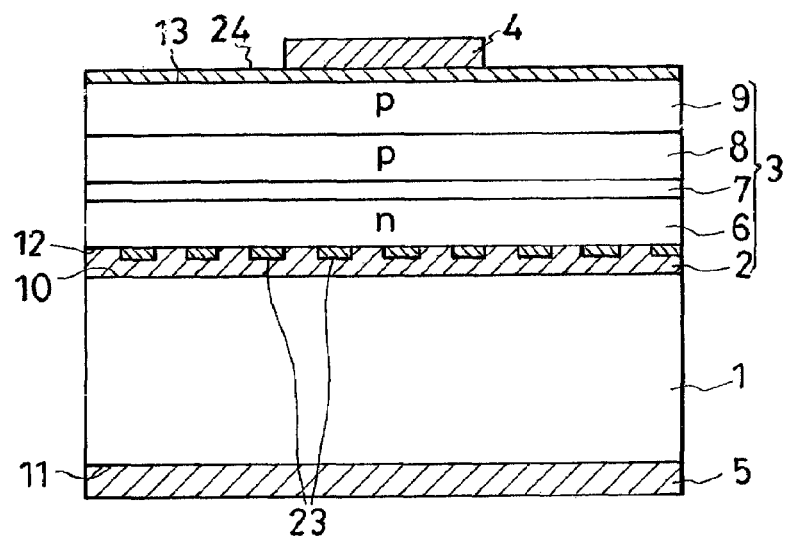
FIG. 11 is a sectional illustration of a still further preferred form of LED according to the invention.

Embodiment of FIG. 11

This embodiment differs from that of FIG. 1 only in additionally incorporating a wavelength converter layer 23 and a transparent electrode 24. Itself well known in the art, the wavelength converter layer 23 is a phosphor film capable of converting the wavelength of the light from the active layer 7. In practice the wavelength converter layer 23 may take the form of either an array of islands, lattice, or parallel strips and may be interposed between reflector layer 2 and light-generating semiconductor region 3. The wavelength converter layer 23 need not be open-worked, however, but may be solid, provided that it is so thin that electrical resistance in its thickness direction is negligible for all practical purposes.

Besides emerging directly from the light-emitting surface 13 of the light-generating semiconductor region 3, the light from the active layer 7 partly falls on the reflector layer 2 via the wavelength converter layer 23 thereby to be reflected toward the light-emitting surface 13 with its wavelength converted. Thus there issues from the light-emitting surface 13 of the light-generating semiconductor region 3 both the light of the original wavelength generated and the light of a different wavelength to which the original wavelength has been shifted by the wavelength converter layer 23. The wavelength converter layer 23 could be used with the LEDs of FIGS. 1, 8, 9 and 10.

The transparent electrode 24, the other feature of this embodiment, constitutes in combination with the bonding pad 4 the anode of the LED. The transparent electrode 24 covers all, or nearly all, the light-emitting surface 13 of the light-generating semiconductor region 3, and the bonding pad 4 is placed centrally on this transparent electrode. Much larger than the bonding pad 4, the transparent electrode 24 assures current flow through the annular outer part of the light-generating semiconductor region 3 and so conduces toward enhancement of LED efficiency. The transparent electrode 24 could be used with the LEDs of FIGS. 1, 8, 9 and 10.

Possible Modifications

Notwithstanding the foregoing detailed disclosure it is not desired that the present invention be limited by the exact showings of the drawings or the description thereof. The following is a brief list of possible modifications, alterations or adaptations of the illustrated exemplary embodiments which are all believed to fall within the purview of the claims annexed hereto:

1. The light-generating semiconductor region 3 may be made from semiconductors other than nitrides, examples being those based on aluminum gallium indium phosphide.

2. A buffer layer of aluminum indium gallium nitride or the like could be interposed between the reflector layer 2 and the n-type cladding 6 of the light-generating semiconductor region 3.

3. The light-emitting surface 13 of the light-generating semiconductor region 3 could be knurled, beaded or otherwise roughened for light emission with higher efficiency.

4. The baseplate 1 could be metal made for combined use as electrode, in which case the second electrode 5 would be unnecessary.

5. The baseplate 1 might be formed by plating a metal on the reflector layer 2 to a required thickness.

6. The indicated conductivity types of the layers of the light-generating semiconductor region 3 are reversible.

7. The baseplate 1 when made from a semiconductor may incorporate a diode or other semiconductor device.

8. A current baffle could be provided on the light-emitting surface 13 of the light-generating semiconductor region 3 in combination with a transparent electrode 24, FIG. 11.

9. The baseplate 1 could be bonded to the light-generating semiconductor region 3 with only either of the bonding agent layers 14 and 15.

What is claimed is:

1. A light-emitting semiconductor device having a reflector layer, the light-emitting semiconductor device comprising:
   (a) a light-generating semiconductor region having a plurality of semiconductor layers for generating light, the light-generating semiconductor region having a pair of opposite major surfaces;
   (b) a baseplate held against one of the pair of opposite major surfaces of the light-generating semiconductor region;
   (c) an electrode on the other major surface of the light-generating semiconductor region; and
   (d) an electroconductive reflector layer interposed between the baseplate and the light-generating semiconductor region for reflecting the light from the light-generating semiconductor region toward said other major surface of the light-generating semiconductor region, the reflector layer being made from a silver-base alloy containing a major proportion of silver and at least one additive selected from the group consisting of copper, gold, palladium, neodymium, silicon, iridium, nickel, tungsten, zinc, gallium, titanium, magnesium, yttrium, indium, and tin, the proportion of the selected additive or additives with respect to that of silver being in the range of from about 0.5 percent by weight to about 10.0 percent by weight.

2. A light-emitting semiconductor device as defined in claim 1, wherein the reflector layer has a thickness ranging from 50 nanometers to 1500 nanometers.

3. A light-emitting semiconductor device as defined in claim 1, wherein the light-generating semiconductor region is made from nitride semiconductors.

4. A light-emitting semiconductor device as defined in claim 1, wherein the electrode is of opaque material and overlies part of said other major surface of the light-generating semiconductor region, and wherein the device further comprises a current baffle interposed between the electrode and the baseplate.

5. A light-emitting semiconductor device as defined in claim 4, wherein the current baffle is embedded in the reflector layer.

6. A light-emitting semiconductor device as defined in claim 1, further comprising a protective covering enveloping the light-generating semiconductor region.

7. A light-emitting semiconductor device as defined in claim 1, further comprising a wavelength converter interposed between the light-generating semiconductor region and the reflector layer.

* * * * *